United States Patent
Kuo et al.

(10) Patent No.: US 7,242,052 B2
(45) Date of Patent: Jul. 10, 2007

(54) NON-VOLATILE MEMORY

(75) Inventors: Ming-Chang Kuo, Hsinchu (TW); Chao-I Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 21 days.

(21) Appl. No.: 11/180,080

(22) Filed: Jul. 11, 2005

(65) Prior Publication Data

US 2006/0240618 A1   Oct. 26, 2006

(30) Foreign Application Priority Data

Apr. 21, 2005  (TW) .............................. 94112669 A (51) Int. Cl.
 *H01L 29/788*  (2006.01)
(52) U.S. Cl. .................. 257/316; 257/314; 257/315; 257/E21.209; 438/257; 365/185
(58) Field of Classification Search ........ 257/314–316; 438/257, 593
See application file for complete search history.

(56) References Cited

U.S. PATENT DOCUMENTS 5,422,504 A * 6/1995 Chang et al. ............... 257/316
5,625,213 A  4/1997 Hong et al. ................. 257/321

OTHER PUBLICATIONS

"A Novel CMOS-Compatible Top-Floating-Gate EEPROM Cell for Embedded Applications" By Author Diarmuid McCathy e al. / IEEE Transactions on Electron Devices, vol. 50, No. 7, Jul. 2003 / p. 1708-1711.
"90-nm-node multi-level AG-AND type flash memory with cell size of true 2 $F^2$/bit and programming throughput of 10 MB/s" By Author Y. Sasago et al / 2003 IEEE.

* cited by examiner

*Primary Examiner*—Dung A. Le
(74) *Attorney, Agent, or Firm*—J.C. Patents (57) ABSTRACT

A stacked structure is formed over a substrate, and the stacked structure has a gate dielectric layer and a floating gate thereon. A first dielectric layer, a second dielectric layer and a third dielectric layer are respectively formed over the top and the sidewalls of the stacked structure and the exposed substrate. A charge storage layer covers over the top and sidewalls of the stacked structure. Also, a pair of auxiliary gates is formed over the substrate beside the charge storage layer, and a gap is between the auxiliary gates and the charge storage layer.

2 Claims, 6 Drawing Sheets

NON-VOLATILE MEMORY

CROSS-REFERENCE TO RELATED APPLICATION

This application claims the priority benefit of Taiwan application serial no. 94112669, filed on Apr. 21, 2005. All disclosure of the Taiwan application is incorporated herein by reference.

BACKGROUND OF THE INVENTION

1. Field of Invention

The present invention relates to a memory device, fabrication method of the memory device and operation of the memory device. More particularly, the present invention relates to a non-volatile memory device, fabrication method of the non-volatile memory device and operation of the non-volatile memory device.

2. Description of Related Art

The non-volatile memory device has the advantages of multiple operations of write, read and erase data on it, and the data stored in it will not disappear while the power is off. Therefore, the non-volatile memory device has been widely used in personal computer and the electronic equipment.

The typical non-volatile memory device usually uses the doped polysilicon to form the floating gate and the control gate over the floating gate. In addition, the floating gate and the control gate are separated by inter-gate dielectric layer, and the floating gate and the substrate are separated by a tunneling layer. Moreover, the source region and the drain region are disposed in the substrate at both sides of the control gate.

When the memory device is performed with the operation of writing data, it is that the control gate, the source region and the drain region are applied with voltages, so as to inject electrons into the floating gate. When memory device is performed with the operation of reading data, it is that the control gate is applied an operation voltage. At this moment, the charging state of the floating gate affects the channel under the floating gate about on/off. The on/off state of channel is used for judgment in reading the data as 0 or 1. When the memory device is performed with the operation of erasing data, it is that the substrate, the source region, the drain region, or the control gate is applied with a relative high voltage, so as to cause the electrons to flow from the floating gate, pass through the tunneling layer, and be ejected to the substrate by the tunneling effect, known as the substrate erase, or flow through the inter-gate dielectric layer and be ejected to control gate.

SUMMARY OF THE INVENTION

As for one of the objectives, the invention provides a method for fabricating a non-volatile memory device, for simplifying the fabrication process, and further reducing the fabrication cost.

As for another one of the objectives, the invention provides a method for fabricating a non-volatile memory device, for increasing the integration.

As further for one of the objectives, the invention provides a method for fabricating a non-volatile memory device, for decreasing the operation voltage on the control gate.

The invention provides a method for fabricating a non-volatile memory device. In the method, a stacked structure is formed on a substrate. The stacked structure includes a gate dielectric layer at bottom and a control gate over the gate dielectric layer. Then, a first dielectric layer, a second dielectric layer and a third dielectric layer are respectively formed on a top and a sidewall of the stacked structure, and an exposed portion of the substrate. A charge storage layer is formed over the top and the sidewall of the stacked structure. A pair of auxiliary gates is formed at each side of the charge storage layer, wherein each of the auxiliary gates is separated from the charge storage layer by a gap.

The invention provides another method for fabricating a non-volatile memory device. In the method, a stacked structure is formed on a substrate. The stacked structure includes a gate dielectric layer, a control gate, and an inter-gate dielectric layer sequentially formed from the substrate. Then, a first dielectric layer and a second dielectric layer are formed over the substrate, covering over the stacked structure and the substrate. Then, a portion of the first dielectric layer and the second dielectric layer is removed, to form a pair of composite dielectric spacers at the sidewalls of the stacked structures. A third dielectric layer is formed over the substrate, to cover over the stacked structure, the composite dielectric spacers, and the substrate. Then, a charge storage layer covers over the top and the sidewall of the stacked structure. A pair of auxiliary gates is formed at both sides of the charge storage layer, wherein each of the auxiliary gates has a separation gap from the charge storage layer.

The invention provides a non-volatile memory device, which includes a substrate, a stacked structure, a first dielectric layer, a second dielectric layer, a third dielectric layer, a pair of auxiliary gates, and a fourth dielectric layer. Wherein, the stacked structure is disposed on the substrate. The stacked structure includes a gate dielectric layer at bottom and a control gate at top. The chare storage layer covers over a top and a sidewall of the stacked structure. The first dielectric layer is disposed between the top of the stacked structure and the charge storage layer. The second dielectric layer is disposed between the sidewall of the stacked structure and the charge storage layer. The third dielectric layer is disposed between the charge storage layer and the substrate. The auxiliary gate is disposed over the substrate at both sides of the stacked structure, and is separated from the charge storage layer by a gap. The fourth dielectric layer is disposed between the auxiliary gate and the substrate.

In accordance with the preferred embodiment of the invention about the non-volatile memory device and its fabrication method, a material of the foregoing charge storage layer can be, for example, polysilicon, silicon nitride, or dielectric layer with high dielectric constant.

In accordance with the preferred embodiment of the invention about the non-volatile memory device and its fabrication method, the foregoing gate dielectric layer, the first dielectric layer, or the second dielectric layer can be a single-layer dielectric structure or a multi-layer dielectric structure.

Since the auxiliary gate formed in the invention is used as a bit line, and the auxiliary gate applied with a proper voltage can cause a region of the substrate under the auxiliary gate to be inverted as a source inverted region or a drain inverted region. The size of memory device can be effectively reduced and the device integration can increase.

The invention provides an operation method for the non-volatile memory device, suitable for use in the foregoing non-volatile memory device. The operation method includes applying a first voltage on the control gate during the programming operation. The first auxiliary gate is applied with a second voltage, so as to cause a region of the substrate under the first auxiliary gate to be inverted as a drain inverted region. The drain inverted region is applied with a third voltage. The second auxiliary gate is set to a floating state. Wherein, the voltages in a sequence form small quantity to large quantity are the third voltage, the second voltage, and the first voltage, so as to cause the electrons to enter the charge storage layer, which is adjacent to the drain inverted region, from the drain inverted region by the FN tunneling effect.

In accordance with the preferred embodiment of the invention about the operation method of the non-volatile memory device, during the programming operation, the control gate is applied with a fourth voltage, and the first auxiliary gate and the second auxiliary gate are applied with a fifth voltage. Thus, the regions of the substrate under the first auxiliary gate and the second auxiliary gate are respectively inverted as a drain inverted region and a source inverted region. The drain inverted region is applied with a sixth voltage and the source inverted region is applied with a seventh voltage. Wherein, the voltages in a sequence from small quantity to large quantity are the seventh voltage, the sixth voltage, the fourth voltage, and the fifth voltage. Thus, the electrons can enter the charge storage layer, which is adjacent to the drain inverted region, from the source inverted region by the effect of channel hot electron (CHE).

In accordance with the preferred embodiment of the invention about the operation method of the non-volatile memory device, during erasing operation, the control gate is applied with an eighth voltage. The second auxiliary gate is applied with a ninth voltage, so as to cause a region of the substrate under the second auxiliary gate to be inverted as a source inverted region. The source inverted region is applied with a tenth voltage, and the first auxiliary gate is set to a floating state. The voltages in a sequence from small quantity to large quantity are the tenth voltage, the ninth voltage, and the eighth voltage, so as to cause electrons to enter the source inverted region from the charge storage layer, which is adjacent to the source inverted region, by the FN tunneling effect.

In accordance with the preferred embodiment of the invention about the operation method of the non-volatile memory device, during the reading operation, the control gate is applied with an eleventh voltage. The first and the second auxiliary gates are applied with a twelfth voltage, so as to cause the regions of the substrate under the first and the second auxiliary gates to be respectively inverted as a drain inverted region and a source inverted region. The drain inverted region is applied with a thirteenth voltage, and the source inverted region is applied with a fourteenth voltage. The voltages in the sequence from small quantity to large quantity are the fourteenth voltage, the thirteenth voltage, the eleventh voltage, and the twelfth voltage, so as to read the binary data stored in the charge storage layer.

Since the invention forms the charge storage layer on the control gate, the over-erase issue in performing the erasing operation can be solve and the device reliability can be further improved. In addition, since the distance between the control gate and the substrate is shorter, the needed operation voltage on the control gate can be reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
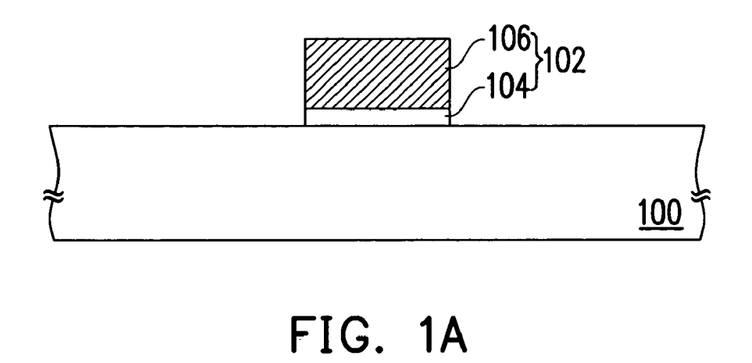
FIGS. 1A–1C are cross-sectional views, schematically illustrating fabrication process for a non-volatile memory device, according to a preferred embodiment of the invention.
Figure 1B:
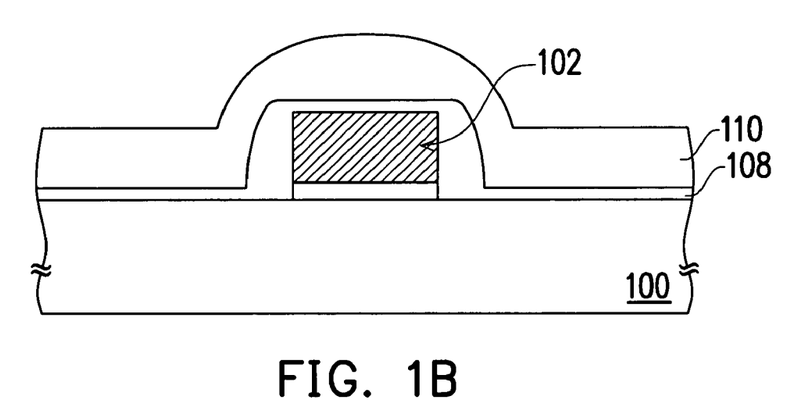
Figure 1C:
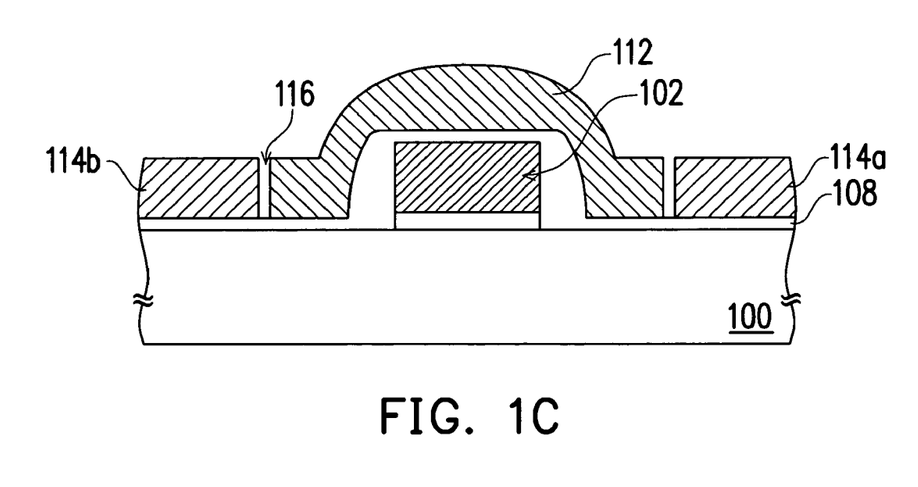

FIGS. 1A–1C are cross-sectional views, schematically illustrating fabrication process for a non-volatile memory device, according to a preferred embodiment of the invention.

In FIG. 1A, a stacked structure 102 is formed over a substrate 100. The stacked structure 102 includes a gate dielectric layer 104 at bottom and a control gate 106 on top. In the embodiment, the gate dielectric layer 104 can be a single-layer structure, such as silicon oxide layer. In another embodiment, the gate dielectric layer 104 can be a dielectric stacked layer in multi-layer structure, such as a stacked layer of silicon oxide/silicon nitride/silicon oxide. In addition, a material for the control gate 106 can be polysilicon, doped polysilicon, or any proper conductive material.

Then, in FIG. 1B, a dielectric material layer 108 is formed over the substrate 100, to cover over the stacked structure 102 and the substrate 100. A material for dielectric material layer 108 can be, for example, silicon oxide or other suitable material, and the fabricating process can be, for example, thermal oxidation, chemical vapor deposition, or other suitable process.

A conductive material layer 110 is formed over the substrate 100. A material for the conductive material layer 110 can be, for example, polysilicon, doped polysilicon, or other suitable material, and a fabrication process can be, for example, chemical vapor deposition.

Then, in FIG. 1C, the conductive material layer 110 is patterned to form a charge storage layer 112 at a top and sidewalls of the stacked structure 102, and a pair of auxiliary gates 114a, 114b over the substrate 100 at both sides of the charge storage layer 112. The auxiliary gates 114a, 114b are separated from the charge storage layer 112 by a gap 116.

Remarkably, the material for the foregoing charge storage layer 112 is not limited to the conductive material. The material with high dielectric constant, such as silicon nitride or aluminum oxide, can also be used as the charge storage material. If the material for the charge storage layer 112 is the material with high dielectric constant, then the charge storage layer 112 and the auxiliary gates 114a, 114b are formed in different processes. In other words, the charge storage layer 112 and the auxiliary gates 114a, 114b need the different processes with different photomasks for respectively patterning.

In addition, remarkably, a portion of the dielectric material layer 108 between the top of the stacked structure 102 and the charge storage layer 112 can serve as an inter-gate dielectric layer. A portion of the dielectric material layer 108 over the substrate 100 can serve as the tunneling layer. A portion of the dielectric material layer 108 between the sidewalls of the stacked structure 102 and the charge storage layer 112 can serve as an insulation spacer. In addition, the material for the gate dielectric layer or the insulation spacer is not limited to a single-layer structure but can be a multi-layer structure. Two embodiments are taken as the examples for descriptions.

Figure 2A:
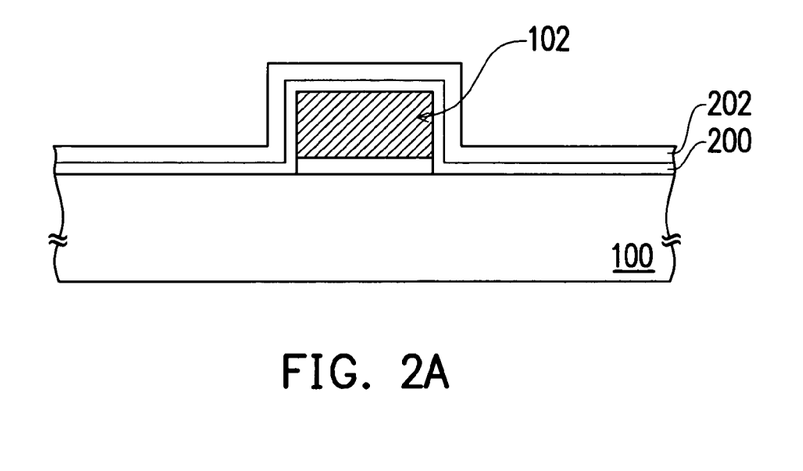
FIGS. 2A–2C are cross-sectional views, schematically illustrating fabrication process for a non-volatile memory device, according to another preferred embodiment of the invention.
Figure 2B:
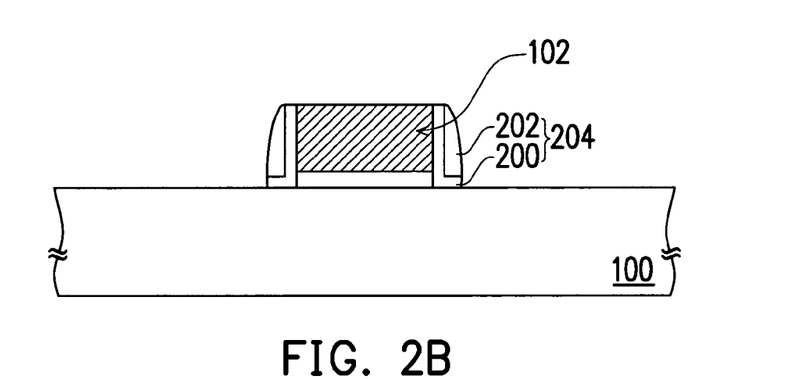
Figure 2C:
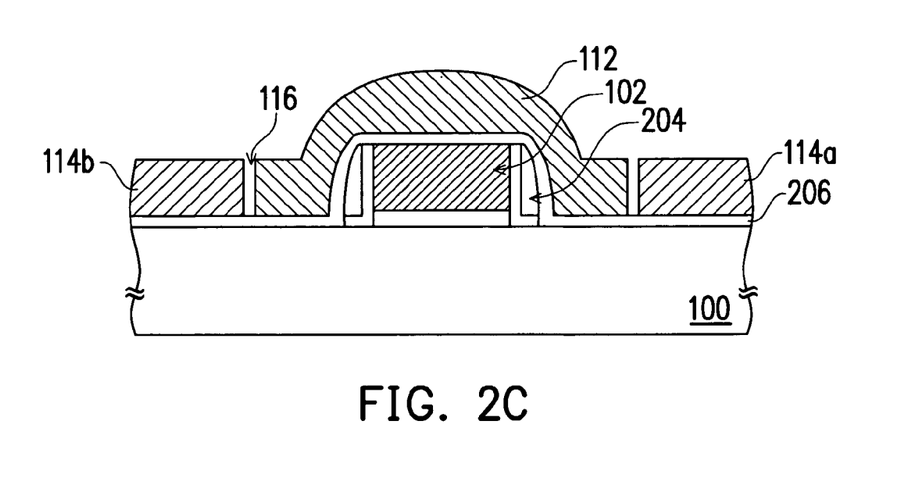

In the following embodiment, the material for the insulation spacer is, for example, a multi-layer dielectric layer. The fabrication process is described as follows. In FIG. 2A, after forming the stacked structure 102 over the substrate 100, dielectric material layers 200 and 202 are formed over the substrate 100, for covering over the stacked structure 102 and the substrate 100. Wherein, a material for the dielectric material layer 200 can be, for example, silicon oxide, and a material for the dielectric material layer 202 can be, for example, silicon nitride. In FIG. 2B, a portion of the dielectric material layers 200 and 202 is removed, to a pair of composite dielectric spacers 204 at the sidewalls of the stacked structure 102. At this state, the top of the stacked structure 102 is exposed. Then, in FIG. 2C, a dielectric material layer 206 is formed over the substrate 100, for covering the stacked structure 102, the composite dielectric spacers 204 and the substrate 100. Wherein, a material for the dielectric material layer 206 can be, for example, silicon oxide. A charge storage layer 112 is formed on the top and the sidewalls of the stacked structure 102. Also and, a pair of the auxiliary gates 114a, 114b is formed over the substrate 100 at both sides of the charge storage layer 112.

Figure 3A:
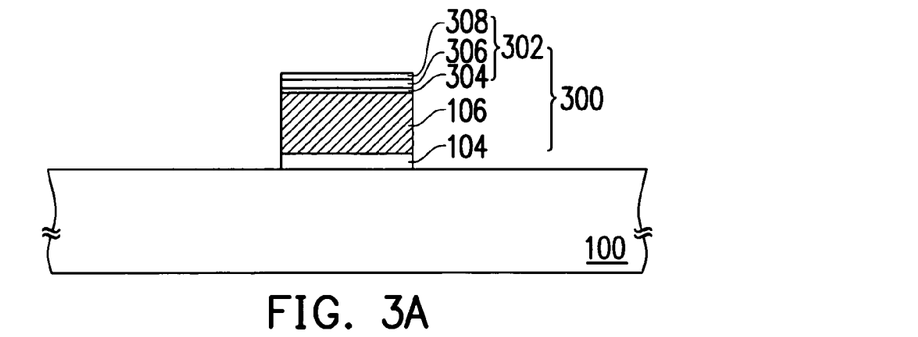
FIGS. 3A–3D are cross-sectional views, schematically illustrating fabrication process for a non-volatile memory device, according to further another preferred embodiment of the invention.
Figure 3B:
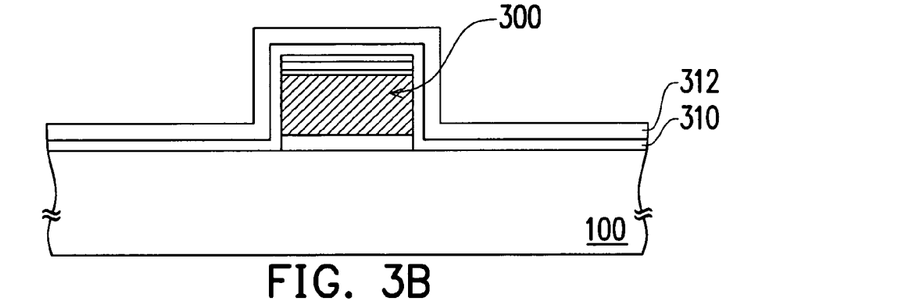
Figure 3C:
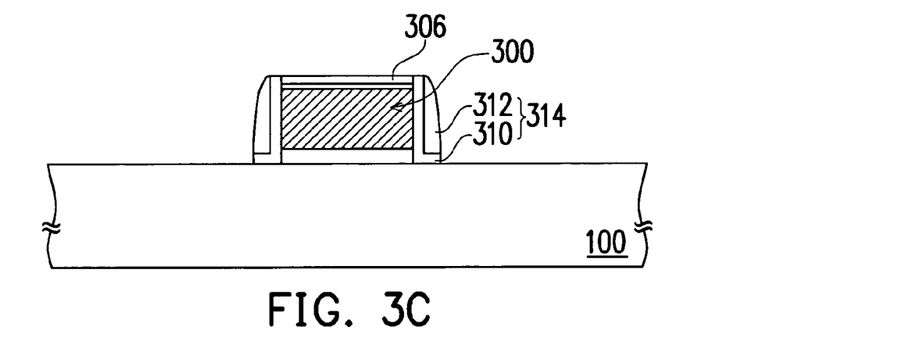
Figure 3D:
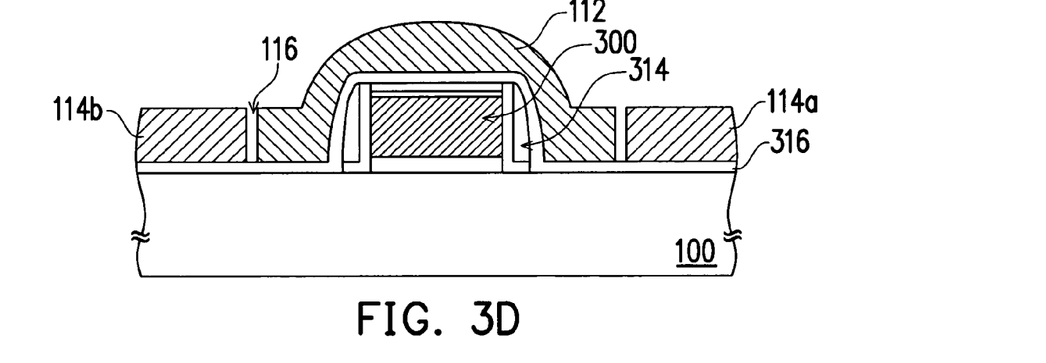

In another embodiment, the gate dielectric layer and the insulation spacer are, for example, in multi-layer dielectric stacked layer. The fabrication process is described as follows. In FIG. 3A, the stacked structure 300 is formed over the substrate 100. The stacked structure 300 from the substrate 100 sequentially includes a gate dielectric layer 104, a control gate 106, and a dielectric stacked layer 302. The dielectric stacked layer 302 includes, for example, silicon oxide layer 304/silicon nitride layer 306/silicon nitride 308 as the stacked layer. In FIG. 3B, dielectric material layers 310 and 312 are formed over the substrate 100, for covering over the stacked structure 300 and the substrate 100. Wherein, a material for the dielectric material layers 310 can be, for example, silicon oxide, and a material for the dielectric material layers 312 can be, for example, silicon nitride. In FIG. 3C, a portion of the dielectric material layers 310 and 312 is removed, to form a pair of composite dielectric spacer 314 at the sidewalls of the stacked structure 300. At this state, the top of silicon nitride 306 in the stacked structure 300 is exposed. In FIG. 3D, a dielectric material layer 316 is formed over the substrate 100, for covering the stacked structure 300, the composite dielectric spacers 314 and the substrate 100. Wherein, a material for the dielectric material layer 316 can be, for example, silicon oxide. Then, a charge storage layer 112 is formed on the top and the sidewalls of the stacked structure 300. Also and, a pair of the auxiliary gates 114a, 114b is formed over the substrate 100 at both sides of the charge storage layer 112.

Remarkably, since the auxiliary gate formed in the invention can be used as the bit line, and when a proper voltage is applied on the auxiliary gate, a region of the substrate under the auxiliary gate can be inverted as a source region or a drain region. As a result, the size of the memory device can be effectively reduced, and the device integration can increase.

A structure of non-volatile memory device of the invention is described as follows.

Figure 4:
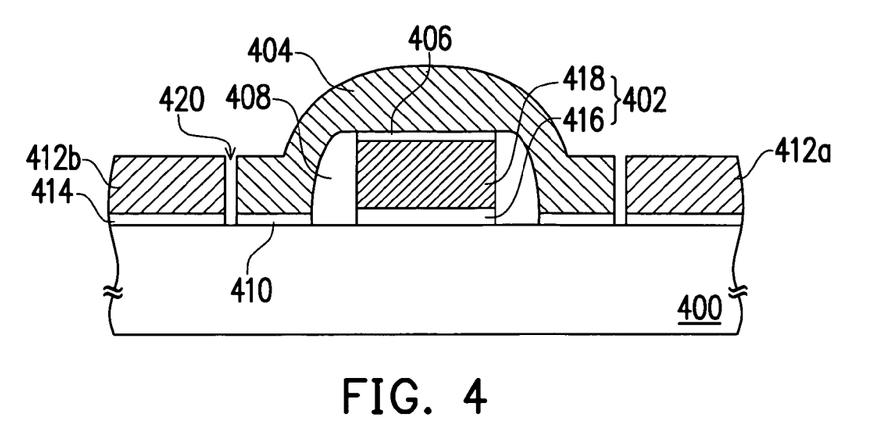
FIG. 4 is a cross-sectional view, schematically illustrating the structure of a non-volatile memory device, according to a preferred embodiment of the invention.

In FIG. 4, the non-volatile memory device of the invention includes a substrate 400, a stacked structure 402, a charge storage layer 404, dielectric layers 406, 408, 410, 414, and a pair of auxiliary gates 412a, 412b.

Wherein, the stacked structure 402 is disposed over the substrate 400. The stacked structure 402 includes the dielectric layer 416 at bottom and a control gate 418 on top. In the embodiment, the gate dielectric layer 416 can be a single-layer structure such as the silicon oxide layer. In another embodiment, the gate dielectric layer 416 can be a multi-layer dielectric stacked layer, such as a stacked layer of silicon oxide/silicon nitride/silicon oxide. In addition, the material for the control layer 418 can be, for example, polysilicon, doped polysilicon, or other suitable conductive material.

In addition, the charge storage layer 404 covers over the top and the sidewalls of the stacked structure 402. The material for the charge storage layer 404 includes polysilicon or dielectric material with high dielectric constant. The dielectric material with high dielectric constant can be, for example, silicon nitride or aluminum oxide, to serve as the charge storage material.

In addition, the dielectric layer 406 is disposed between the top of the stacked structure 402 and the charge storage layer 404, and the dielectric layer 406 can serve as an inter-gate dielectric layer. The material for the dielectric layer 406 can be, for example, silicon oxide or other suitable material.

In addition, the dielectric layer 408 is disposed between the sidewalls of the stacked structure 402 and the charge storage layer 404, and the dielectric layer 408 can serve as an insulation spacer. The material for the dielectric layer 408 can be, for example, silicon oxide or other suitable material.

In addition, the dielectric layer 410 is disposed between the charge storage layer 404 and the substrate 400, and the dielectric layer 410 can serve as a tunneling layer. The material for the dielectric layer 410 can be, for example, silicon oxide or other suitable material.

In addition, the auxiliary gates 412a, 412b are disposed over the substrate 400 at both sides of the stacked structure 402, and are separated from the charge storage layer 404 by a gap 420. The material for the auxiliary gates 412a, 412b can be, for example, polysilicon or doped polysilicon. In addition, the dielectric layer 414 is disposed between the auxiliary gates 412a, 412b and the substrate 400. The material for the dielectric layer 414 can be, for example, silicon oxide or other suitable material.

Figure 5:
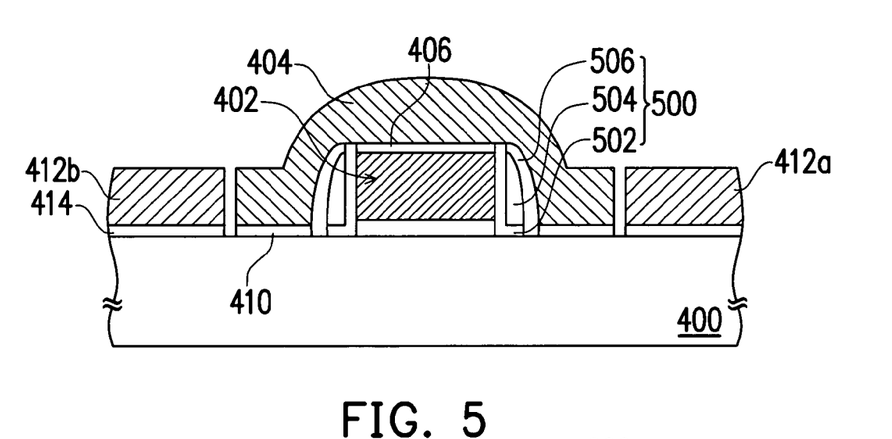
FIG. 5 is a cross-sectional view, schematically illustrating the structure of a non-volatile memory device, according to another preferred embodiment of the invention.
Figure 6:
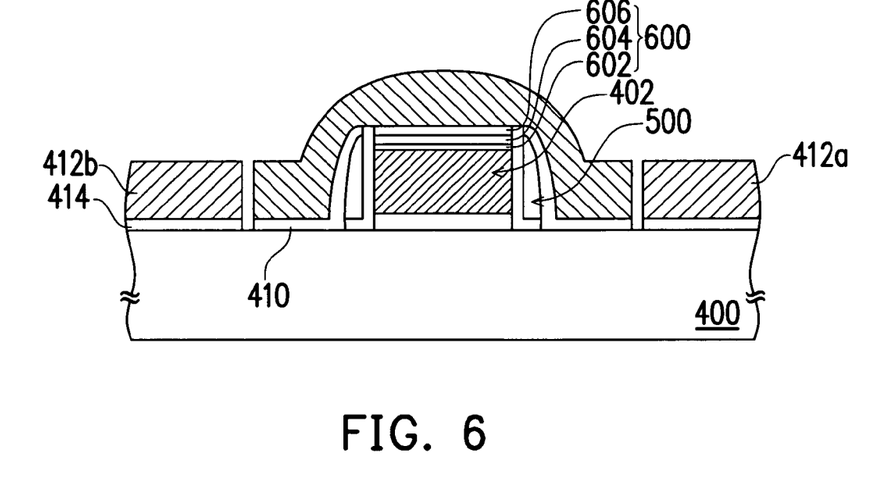
FIG. 6 is a cross-sectional view, schematically illustrating the structure of a non-volatile memory device, according to further another preferred embodiment of the invention.

Remarkably, the foregoing dielectric layer 408 is not limited to a single-layer structure, and can be a multi-layer dielectric stacked layer 500 (see FIG. 5). In FIG. 5, the dielectric stacked layer 500 can be, for example, formed form silicon oxide 502/silicon nitride 504/silicon oxide 506. In addition to the dielectric stacked layer 500 on the sidewalls of the stacked structure 402, a dielectric stacked layer 600 (see FIG. 6) can be disposed on the top of the stacked structure 402. In other words, the dielectric layer 406 in FIG. 4 is replaced by the multi-layer dielectric stacked layer 600, and the dielectric stacked layer 600 can be, for example, formed form silicon oxide 602/silicon nitride 604/silicon oxide 606.

Since the non-volatile memory device of the invention is implemented with the auxiliary gates 412a, 412b, and the auxiliary gates 412a, 412b can be used as the bit line. When a proper voltage is applied on the auxiliary gates 412a, 412b, a region of the substrate under the auxiliary gates 412a, 412b can be inverted as a source region or a drain region. As a result, the size of the memory device can be effectively reduced, and the device integration can increase.

Figure 7:
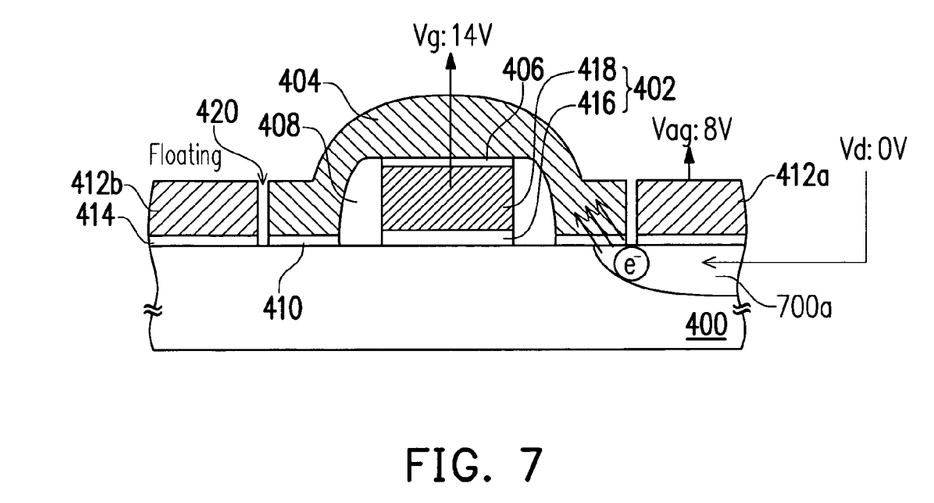
FIG. 7 is a drawing, schematically performing a programming operation on the non-volatile memory device in FIG. 4.

An operation method on the non-volatile memory device of the invention is described as follows. In FIG. 7, during a programming operation, a control voltage Vg is applied with the control gate 418. The auxiliary gate 412a is applied with an auxiliary voltage Vag, so as to cause a region of the substrate 400 under the auxiliary gate 412a to be inverted as a drain inverted region 700a. The drain inverted region 700a is applied with a drain voltage Vd, and the auxiliary gate 412b is set to a floating state. Wherein, the drain voltage, the auxiliary voltage, and the control voltage are in a quantity sequence form small quantity to large quantity. As a result, it allows electrons to enter the charge storage layer 404, which is adjacent to the drain inverted region 700a, from the drain inverted region 700a by an FN tunneling effect. In the embodiment, the control voltage is, for example, 14 volts, the auxiliary voltage is, for example, 8 volts, and the drain voltage is, for example, o volt.

Figure 8:
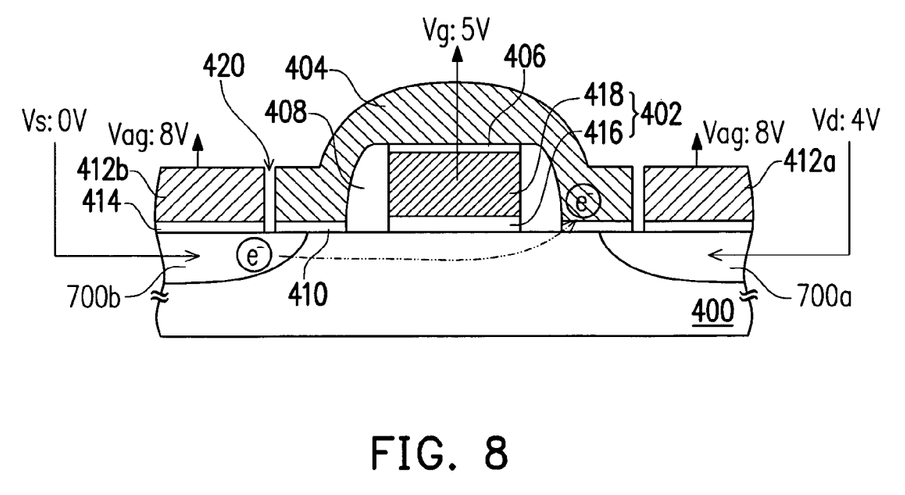
FIG. 8 is a drawing, schematically performing further another programming operation on the non-volatile memory device in FIG. 4.

In FIG. 8, for another embodiment, the programming operation for the non-volatile memory device of the invention can also be as follows. The control gate 418 is applied with a control voltage Vg, the auxiliary gates 412a and 412b are applied with an auxiliary voltage Vag, so that the regions of the substrate 400 under the auxiliary gates 412a and 412b are respectively inverted as a drain inverted region 700a and a source inverted region 700b. The drain inverted region 700a is applied with a drain voltage Vd and the source inverted region 700b is applied with a source voltage Vs. Wherein, the source voltage, the drain voltage, the control voltage, and the auxiliary voltage are in a quantity sequence from small quantity to large quantity. As a result, it allows electrons to enter the charge storage layer 404, which is adjacent to the drain inverted region 700a, from the source inverted region 700b through a channel region in the substrate 400 under control gate 418, by an effect of channel hot electron (CHE). In the embodiment, the control voltage can be, for example, 5 volts, the auxiliary voltage can be, for example, 8 volts, the drain voltage can be, for example, 4 volts, and the source voltage can be, for example, 0 volt.

Figure 9:
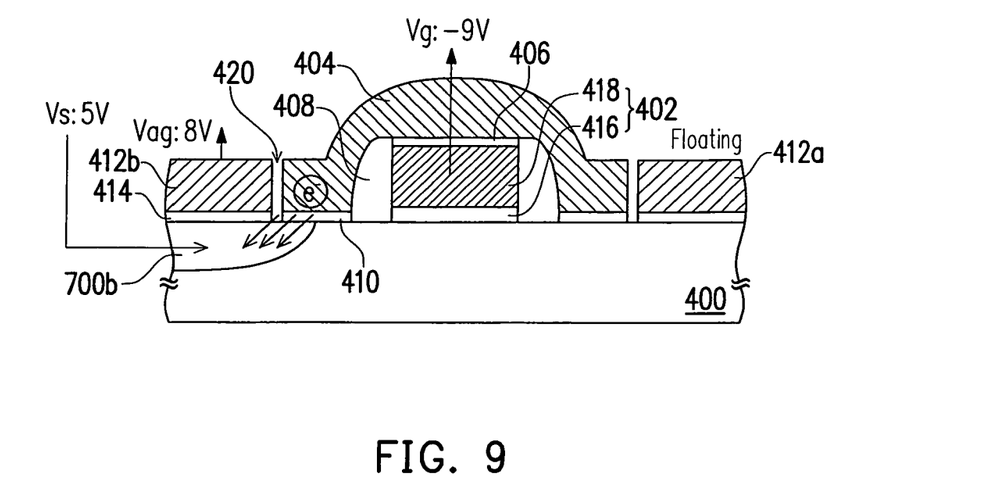
FIG. 9 is a drawing, schematically performing an erasing operation on the non-volatile memory device in FIG. 4.

In addition, in FIG. 9, an erasing operation for the non-volatile memory device of the invention can also be as follows. The control gate 418 is applied with a control voltage Vg. The auxiliary gate 412b is applied with an auxiliary voltage Vag, so as to cause a region of the substrate 400 under the auxiliary gate 412b to be inverted as a source inverted region 700b. The source inverted region 700b is applied with a source voltage Vs voltage, and the auxiliary gate 412a is set to a floating state. Wherein, the source voltage, the auxiliary voltage, and the control voltage are in a quantity sequence from small quantity to large quantity, so as to cause electrons to enter the source inverted region 700b from the charge storage layer 404, which is adjacent to the source inverted region 700b, by an FN tunneling effect. In the embodiment, the control voltage can be, for example, −9 volts, the auxiliary voltage can be, for example, 8 volts, and the source voltage can be, for example, 5 volts.

Particularly, since the charge storage layer 404 of the invention is disposed over the control gate 418, the over-erase issue during performing the erasing operation can be solved, and the device reliability can be improved.

Figure 10:
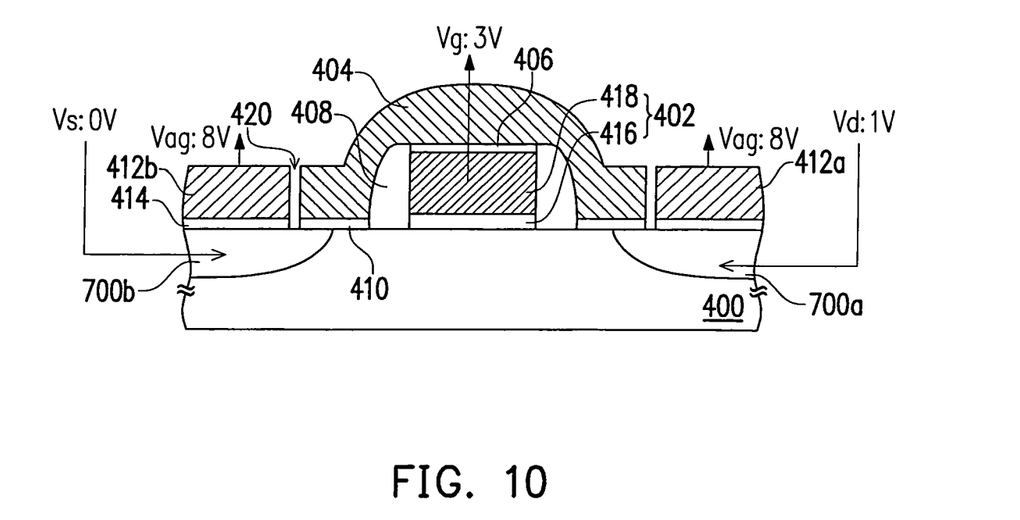
FIG. 10 is a drawing, schematically performing a reading operation on the non-volatile memory device in FIG. 4.

Further, in FIG. 10, a reading operation for the non-volatile memory device of the invention can also be as follows. The control gate 418 is applied with a control voltage Vg. The auxiliary gates 412a and 412b are applied with an auxiliary voltage Vag, so as to cause regions of the substrate 400 under the auxiliary gates 412a and 412b to be respectively inverted as a drain inverted region 700a and a source inverted region 700b. The drain inverted region 700a is applied with a drain voltage Vd, and the source inverted region 700b is applied with a source voltage Vs. Wherein, the source voltage, the drain voltage, the control voltage, and the auxiliary voltage are in a quantity sequence from small quantity to large quantity, so as to read a binary data stored in the charge storage layer 404. In the embodiment, the control voltage can be, for example, 3 volts, the auxiliary voltage can be, for example, 8 volts, the drain voltage can be, for example, 1 volt, and the source voltage can be, for example, 0 volt.

Particularly, in the foregoing operations, the description as an example is about programming, erasing, and reading for one binary data. However, the invention is not limited in this manner. If the charge storage layer of the non-volatile memory device in the invention is a dielectric material with high dielectric constant, then, the left and right sides of the charge storage layer can be respectively stored by one binary data. As a result, the memory device of the invention can be used as a multiple-stage memory device.

In summary, the invention at least has the advantages as follows:

1. The auxiliary gate of the invention can be used as the bit line. After the auxiliary gate is applied with a proper voltage, a region of the substrate under the auxiliary gate can be inverted as a source region or a drain region, so that the size of the memory device can be effectively reduced, and the device integration is improved.

2. Since the charge storage layer is disposed over the control gate, the over-erase issue during performing the erasing operation can be solved, and then the device reliability can be improved.

3. Since the distance between the control gate and the substrate for the non-volatile memory device of the invention, the operation voltage for the control gate can be reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A non-volatile memory device, comprising:
   a substrate;

a stacked structure, disposed over the substrate, the stacked structure comprising a gate dielectric layer and a control gate on the gate dielectric layer;

a charge storage layer, covering a top and a sidewall of the stacked structure;

a first dielectric layer, disposed between the top of the stacked structure and the charge storage layer;

a second dielectric layer, disposed between the sidewall of the stacked structure and the charge storage layer;

a third dielectric layer, disposed between the charge storage layer and the substrate;

a pair of auxiliary gates, denoted as a first auxiliary gate and a second auxiliary gate, disposed over the substrate at both sides of the stacked structure and separating from the charge storage layer by a gap; and a fourth dielectric layer, disposed between each of the auxiliary gates and the substrate;

wherein a material for the charge storage layer comprises polysilicon, silicon nitride or dielectric material with high dielectric constant.

2. The non-volatile memory device of claim 1, wherein the gate dielectric layer, the first dielectric layer or the second dielectric layer is a single-layer structure or a multi-layer stacked structure.

* * * * *